(12) United States Patent
Ahn et al.

(10) Patent No.: US 7,393,796 B2
(45) Date of Patent: *Jul. 1, 2008

(54) COMPOSITE DIELECTRIC FORMING METHODS AND COMPOSITE DIELECTRICS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/519,431

(22) Filed: Sep. 11, 2006

(65) Prior Publication Data

US 2007/0037409 A1 Feb. 15, 2007

Related U.S. Application Data

(63) Continuation of application No. 11/261,530, filed on Oct. 28, 2005, now Pat. No. 7,105,461, which is a continuation of application No. 10/225,715, filed on Aug. 21, 2002, now Pat. No. 6,960,538.

(51) Int. Cl.
*H01L 21/469* (2006.01)
*H01L 21/31* (2006.01)

(52) U.S. Cl. .................. 438/785; 257/E21.01; 438/778

(58) Field of Classification Search .................. 438/778, 438/785; 257/E21.01
See application file for complete search history.

(56) References Cited

U.S. PATENT DOCUMENTS

| | | | |
|---|---|---|---|
| 6,660,660 B2 | 12/2003 | Haukka et al. | |
| 6,960,538 B2 | 11/2005 | Ahn et al. | |
| 7,105,461 B2 * | 9/2006 | Ahn et al. | 438/778 |
| 2002/0172768 A1 | 11/2002 | Endo et al. | |
| 2002/0192974 A1 | 12/2002 | Ahn et al. | |
| 2003/0227033 A1 | 12/2003 | Ahn et al. | |
| 2004/0043149 A1 | 3/2004 | Gordon | |

OTHER PUBLICATIONS

J.M. Leger et al., Pressure-Induced phase transistions and volume changes in HfO$_2$ up to 50 GPa, Jun. 1993 Physical Review B, vol. 48, No. 1, pp. 93-98.

I.A. El-Shanshoury et al., "Polymorphic Behavior of Thin Evaporated Films of Zirconium and Hafnium Oxides", Aug. 1969, Journal of The American Ceramic Society, vol. 53, No. 5, pp. 264-268.

M. Ritala et al., "Development of crystallinity and morphology in hafnium dioxide thin films grown by atomic layer epitaxy", Apr. 1994, Thin Solid Films, 250, pp. 72-80.

K. Kukli et al., "Tailoring the dielectric properties of HfO$_2$—Ta$_2$O$_5$ nanolaminates", Apr. 1996, Applied Phys. Letters 68, pp. 3737-3739.

(Continued)

*Primary Examiner*—Asok K Sarkar
(74) *Attorney, Agent, or Firm*—Wells St. John P.S.

(57) ABSTRACT

A composite dielectric forming method includes atomic layer depositing alternate layers of hafnium oxide and lanthanum oxide over a substrate. The hafnium oxide can be thermally stable, crystalline hafnium oxide and the lanthanum oxide can be thermally stable, crystalline lanthanum oxide. A transistor may comprise the composite dielectric as a gate dielectric. A capacitor may comprise the composite dielectric as a capacitor dielectric.

20 Claims, 2 Drawing Sheets

OTHER PUBLICATIONS

J. Aarik, et al, "Influence of substrate temperature on atomic layer growth and properties of $HfO_2$ thin films", Aug. 1998, Thin Solid Films 340, pp. 110-116.

T. Suntola, "Atomic Layer Epitaxy", Apr. 1989, Materials Science Reports 4, pp. 261-312.

M. Ritala, et al, "Perfectly Conformal TiN and $Al_2O_3$ Films Deposited by Atomic Layer Deposition", 1999, Chemical Vapor Deposition, pp. 5-7.

K. Kukli, et al, "Properties of $Ta_2O_5$-Based Dielectric Nanolaminates Deposited by Atomic Layer Epitaxy", Jan. 1997, J.Electrochem.Soc., vol. 144, No. 1, pp. 300-306.

J. Aarik, et al "Effect of growth conditions on formation of $TiO_2$-II thin films in atomic layer deposition process", Apr. 1997, J. Crystal Growth 181, pp. 259-264.

K. J. Eisentraut and R.E. Stevers, "Volatile Rare Earth Chelates", Nov. 1965, Journal of the American Chemical Society, 87:22, pp. 5254-5256.

G.D. Wilk et al., "High-K gate dielectric: Current status and materials properties considerations", May 2001, Journal of Applied Physics, vol. 89, No. 10, pp. 5243-5275.

Nieminen, M. et al., "Formation and stability of Lanthanum oxide thin films deposited from βdiketonate precursor", Jan. 2001, Applied Surface Science, vol. 174, No. 2, pp. 155-165.

H. Ibegazene, et al, "Yttria-stabilized hafnia-zirconia thermal barrier coatings: the influence of hafnia addition addition on TBC structure and high-temperature behavior", Journal of Materials Science 30, pp. 938-951, Feb. 1995.

J. Wang et al., "Hafnia and hafnia-toughened ceramics", 1992, Journal of Materials Science, 27, pp. 5397-5430.

J.M. Leger et al., "Materials potentially harder than diamond: Quenchable high-pressure phase of transition Metal dioxides", 1994, Journal of Materials Science Letters 13, pp. 1688-1690.

* cited by examiner

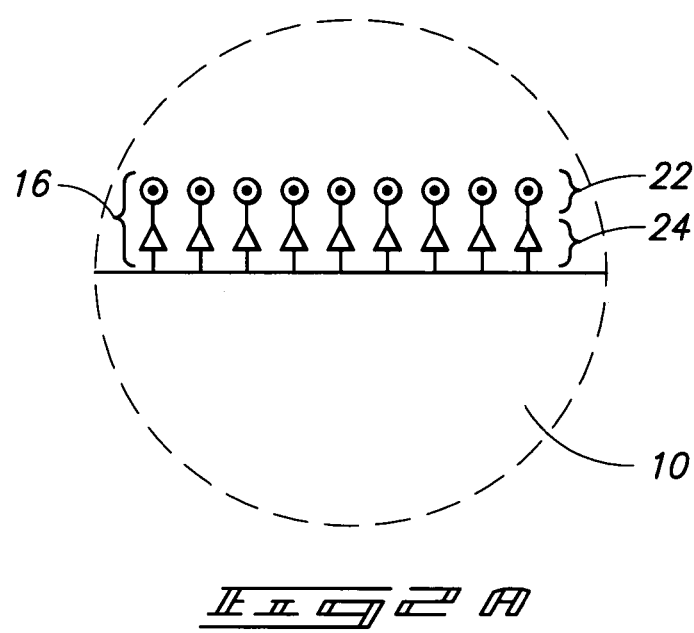
_FIG. 2A_
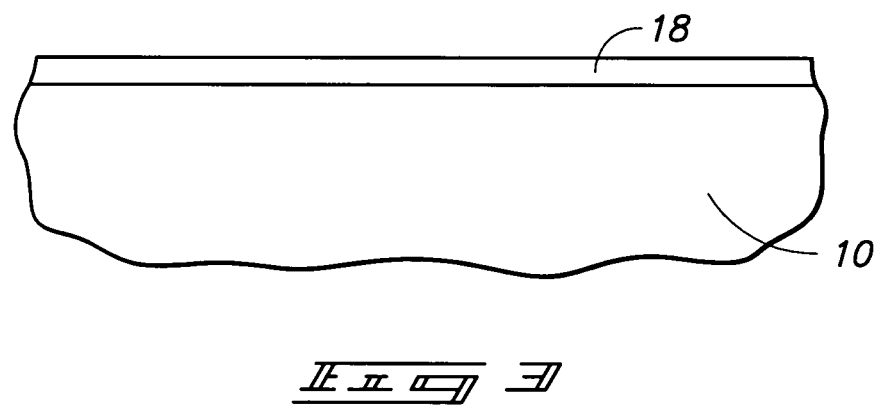
_FIG. 3_
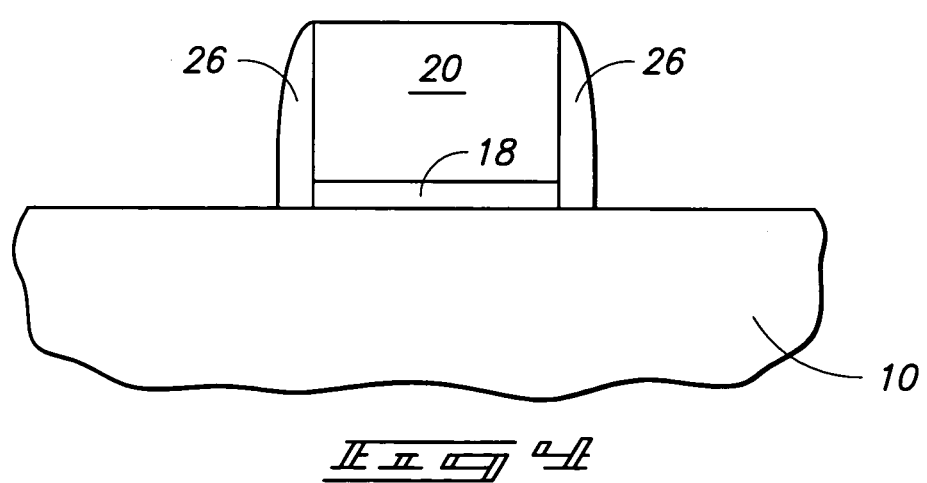
_FIG. 4_

US 7,393,796 B2

COMPOSITE DIELECTRIC FORMING METHODS AND COMPOSITE DIELECTRICS

RELATED PATENT DATA

This patent resulted from a continuation application of U.S. patent application Ser. No. 11/261,530, filed Oct. 28, 2005, now U.S. Pat. No. 7,105,461, which resulted from a continuation application of U.S. patent application Ser. No. 10/225,715, filed on Aug. 21, 2002, now U.S. Pat. No. 6,960,538, which are incorporated herein by reference.

TECHNICAL FIELD

The present invention pertains to composite dielectric forming methods as well as composite dielectrics, including those formed by the described method. In particular, the invention pertains to composite dielectrics containing both hafnium oxide and lanthanum oxide.

BACKGROUND OF THE INVENTION

Increasing the performance of integrated circuits (ICs), both with regard to more complex functionality and higher speeds, is a primary goal of efforts in advancing the semiconductor arts. One method that has been extensively employed to achieve this goal is scaling, that is, decreasing area or size of individual device components that are used to form such integrated circuits. For example, the gate width of a typical MOS transistor has been reduced over the past several years from several microns to fractions of a micron and gate widths of 0.1 micron or less may soon be desired. Such scaling efforts have also effected the size of capacitors used in a variety of ICs such as DRAMS and SRAMS (dynamic and static random access memories, respectively).

While such scaling efforts have resulted in the desired increases in performance, generally such size reductions also impact at least some characteristics of the devices so "scaled." For example, reducing the gate width of a transistor generally reduces the transistor's output and decreasing the size of a capacitor generally reduces the capacitance or amount of charge such a capacitor can store. As transistor gate width is reduced, the gate dielectric layer thickness can also be reduced to at least partially compensate for the change in device output. Similarly, as the size of capacitor structures is reduced, materials such as hemispherically grained polysilicon (HSG) can be employed to increase the effective surface area of such structures and compensate, at least in part, for such size reductions.

Silicon dioxide ($SiO_2$), with a dielectric constant of about 3.9, remains the most common material employed for gate dielectric layers. To maintain transistor output at an acceptable level, a transistor having a gate width of 0.1 micron can use an ultra-thin $SiO_2$ layer with a thickness of about 2 nanometers (nm). Ultra-thin being defined herein as a thickness of about 5 nm or less.

The forming and use of such ultra-thin $SiO_2$ layers is problematic for a variety of reasons since such layers consist of only a few layers of molecules. Thus only one additional or missing layer of molecules can have a dramatic effect on device performance. One method of reducing these problems is the use of a thicker layer of an alternative dielectric material such as a metal oxide having a higher dielectric constant than that of $SiO_2$. For the purpose of illustration, a metal oxide gate dielectric having an appropriately high dielectric constant can be formed with a thickness several times that of a $SiO_2$ layer while having the performance characteristics of the thinner $SiO_2$ layer. Thus the thicker metal oxide layer is said to have the equivalent oxide thickness (EOT) of the thinner layer. Alternate metal oxide materials such as titanium oxide ($TiO_2$), aluminum oxide ($Al_2O_3$), tantalum oxide ($Ta_2O_5$) and others have therefore received attention as replacements for $SiO_2$. However, such alternate materials preferably additionally exhibit a large band-gap with a favorable band alignment, good thermal stability, and the ability to be formed in a manner consistent with known semiconductor process methods at reasonable cost and yield.

Unfortunately, many candidate metal oxide materials having an appropriately high dielectric constant, do not meet these additional requirements. Thus it is desirable to provide alternate dielectric materials and methods of forming such materials that are appropriate as a replacement for $SiO_2$.

SUMMARY OF THE INVENTION

According to one aspect of the invention, a composite dielectric forming method includes atomic layer depositing alternate layers of hafnium oxide and lanthanum oxide over a substrate. As an example, the hafnium oxide can include thermally stable, crystalline hafnium oxide and the lanthanum oxide can include thermally stable, crystalline lanthanum oxide.

In another aspect of the invention, a composite dielectric forming method includes chemisorbing at least one monolayer of a first material over a substrate, the first material containing a first metal, and treating at least some of the chemisorbed first material, forming an oxide of the first metal. The method includes chemisorbing on the first metal oxide at least one monolayer of a second material containing a second metal and treating at least some of the chemisorbed second material, forming an oxide of the second metal. One of the first and second metals includes hafnium and the other includes lanthanum. As an example, the first material includes $HfCl_4$. Alternatively, the first material can include $La(thd)_3$. Treating the chemisorbed first material can include exposure to $H_2O$.

According to a further aspect of the invention, a composite dielectric forming method includes atomic layer depositing a first material on a substrate using a first precursor containing a first metal, exposing the deposited first material to oxygen, and forming an oxide of the first metal. The method includes atomic layer depositing a second material on the first metal oxide using a second precursor containing a second metal, exposing the deposited second material to oxygen, and forming an oxide of the second metal. One of the first and second metals includes hafnium and the other includes lanthanum.

In a still further aspect of the invention, a composite dielectric includes alternate monolayers of hafnium oxide and lanthanum oxide over a substrate. As an example, the composite dielectric can include a plurality of single hafnium oxide monolayers interspersed among a plurality of single lanthanum oxide monolayers. Alternatively, the composite dielectric can include a plurality of hafnium oxide multilayers interspersed among a plurality of lanthanum oxide multilayers, the multilayers including multiple monolayers.

BRIEF DESCRIPTION OF THE DRAWINGS

Preferred embodiments of the invention are described below with reference to the following accompanying drawings.

FIG. 2A is an enlarged view of a portion of the transistor construction shown in FIG. 2.

FIG. 3 is a partial sectional view of a transistor construction at a process stage subsequent to that shown in FIG. 2.

FIG. 4 is a partial sectional view of a transistor construction at a process stage subsequent to that shown in FIG. 3.

DETAILED DESCRIPTION OF THE PREFERRED EMBODIMENTS

Figure 1:
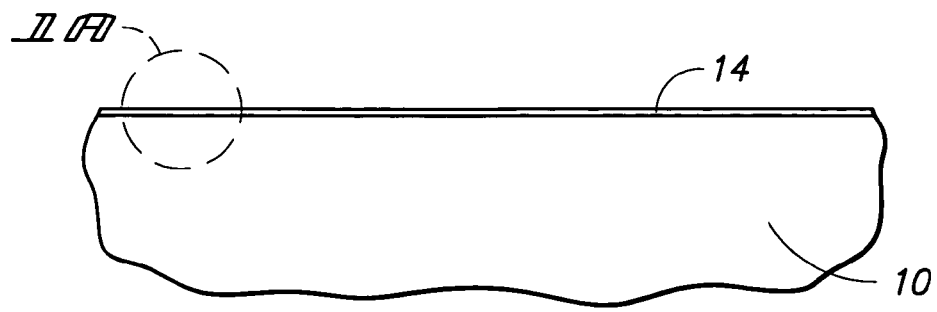
FIG. 1 is a partial sectional view of a transistor construction at an intermediate process stage according to one aspect of the invention.

Material properties of various high-K dielectric materials for gate dielectrics are discussed in a recent article by G. D. Wilk, et al., *High-K Gate Dielectric: Current Status and Materials Properties Considerations*, Journal of Applied Physics, vol. 89, no. 10, pp. 5243-5275 (May, 2001). Table 1 summarizes information from Wilk et al.

TABLE 1

| Material | Dielectric Constant (K) | Band gap $E_G$ (eV) | $\Delta E_C$ (eV) to Si | Crystal Structure(s) |
|---|---|---|---|---|
| $SiO_2$ | 3.9 | 8.9 | 3.2 | Amorphous |
| $Si_3N_4$ | 7 | 5.1 | 2 | Amorphous |
| $Al_2O_3$ | 9 | 8.7 | 2.8 | Amorphous |
| $Y_2O_3$ | 15 | 5.6 | 2.3 | Cubic |
| $La_2O_3$ | 30 | 4.3 | 2.3 | Hexagonal, cubic |
| $Ta_2O_5$ | 26 | 4.5 | 1-1.5 | Orthorhombic |
| $TiO_2$ | 80 | 3.5 | 1.2 | Tetragonal (rutile, anatase) |
| $HfO_2$ | 25 | 5.7 | 1.5 | Monoclinic, tetragonal, cubic |
| $ZrO_2$ | 25 | 7.8 | 1.4 | Monoclinic, tetragonal, cubic |

The inventors recognized the advantage of a composite dielectric containing hafnium oxide and lanthanum oxide as described in U.S. patent application Ser. No. 09/881,408, filed Jun. 13, 2001, entitled *A Dielectric Layer Forming Method And Devices Formed Therewith*, the subject matter of which is incorporated herein by reference for its pertinent and supportive teachings. However, improved performance characteristics can be achieved with the composite dielectrics described herein that also include hafnium oxide and lanthanum oxide.

Hafnium dioxide ($HfO_2$) is a dielectric material having a relatively high refractive index of 25 and a wide band gap of 5.7 electron volts (eV). For this reason, the material may be used in optical coatings. Further, hafnium dioxide may be used in protective coatings because of its thermal stability and hardness. At about 20° C. (room temperature) and about 1 atmosphere pressure (atmospheric pressure), pure hafnium dioxide tends to appear in the monoclinic phase. However, hafnium dioxide can crystallize in different forms (form polymorphs) that are more hard and/or dense than the monoclinic phase. For example, a tetragonal phase of hafnium dioxide has been observed at high pressure and reported to exhibit a hardness comparable to that of diamond.

The tetragonal phase, as well as orthorhombic hafnium dioxide also formed at high pressure, may be quenched to atmospheric pressure. A high temperature cubic phase has further been observed in thin film grown by oxidation of hafnium and annealing at 500 to 600° C. Tetragonal and/or orthorhombic phases of hafnium dioxide can also be formed by atomic layer deposition (ALD). Such polymorphs are normally considered metastable, but might be stabilized in ALD thin films due to size effects and/or intrinsic strains. The contribution of both these factors appears to increase with decreasing film thickness. Accordingly, thin film growth methods allowing precise control of film thickness may be used to study and achieve stabilization of various hafnium dioxide crystalline structures.

ALD of $La_2O_3$ thin films has also been accomplished between 180 to 425° C. on soda-lime glass and (100) silicon substrates at a reduced pressure of 2 to 3 millibar. Accordingly, an expectation exists that metastable or even stable $La_2O_3$ may be formed by ALD as well.

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), pulsed CVD, etc., but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not-limited to, the semiconductive substrates described above.

Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first specie is purged from over the substrate and a second chemical specie is provided to react with the first monolayer of the first specie. The second specie is then purged and the steps are repeated with exposure of the second specie monolayer to the first specie. In some cases, the two monolayers may be of the same specie. As an option, the second specie can react with the first specie, but not chemisorb additional material thereto. That is, the second specie can cleave some portion of the chemisorbed first specie, altering such monolayer without forming another monolayer thereon. Also, a third specie or more may be successively chemisorbed (or reacted) and purged just as described for the first and second species.

Purging may involve a variety of techniques including, but not limited to, contacting the substrate and/or monolayer with a carrier gas and/or lowering pressure to below the deposition pressure to reduce the concentration of a specie contacting the substrate and/or chemisorbed specie. Examples of carrier gases include $N_2$, Ar, He, etc. Purging may instead include contacting the substrate and/or monolayer with any substance that allows chemisorption byproducts to desorb and reduces the concentration of a contacting specie preparatory to introducing another specie. The contacting specie may be reduced to some suitable concentration or partial pressure known to those skilled in the art based on the specifications for the product of a particular deposition process.

ALD is often described as a self-limiting process, in that a finite number of sites exist on a substrate to which the first specie may form chemical bonds. The second specie might only bond to the first specie and thus may also be self-limiting. Once all of the finite number of sites on a substrate are bonded with a first specie, the first specie will often not bond to other of the first specie already bonded with the substrate. However, process conditions can be varied in ALD to promote such bonding and render ALD not self-limiting. Accordingly, ALD may also encompass a specie forming other than one monolayer at a time by stacking of a specie, forming a layer more than one atom or molecule thick. The various aspects of the present invention described herein are applicable to any circumstance where ALD may be desired. A few examples of materials that may be deposited by ALD include hafnium oxide, lanthanum oxide, and others.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition specie that chemisorbs to a substrate or reacts with a previously deposited specie. An ALD process regime may provide a simultaneously contacted plurality of species of a type or under conditions such that ALD chemisorption, rather than CVD reaction occurs. Instead of reacting together, the species may chemisorb to a substrate or previously deposited specie, providing a surface onto which subsequent species may next chemisorb or react to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed specie. Other process conditions, for example, pressure and temperature, may also influence chemisorption rate.

According to one aspect of the invention, a composite dielectric forming method includes ALD of alternate layers of hafnium oxide and lanthanum oxide over a substrate. The hafnium oxide can include thermally stable, crystalline hafnium oxide. The lanthanum oxide can include thermally stable, crystalline lanthanum oxide. It is an advantage of the various aspects of the invention described herein that ALD allows formation of metastable or stable crystalline structures. As indicated above, the appearance of metastable hafnium dioxide polymorphs in thin films provides evidence that such crystalline phases may be stabilized as a result of size effects and/or intrinsic strains. The contribution of these factors apparently increases with decreasing film thickness.

Accordingly, atomic layer deposition wherein film thickness can be precisely controlled provides optimum circumstances for stabilizing crystalline phases of hafnium oxide and lanthanum oxide. The method can include forming one hafnium oxide monolayer, forming one lanthanum oxide monolayer, and repeating to form a plurality of single hafnium oxide monolayers interspersed among a plurality of single lanthanum oxide monolayers. With each monolayer of hafnium oxide formed one molecule thick, the likelihood of stabilization is maximized.

However, a suitable composite dielectric may be formed without maximizing the likelihood of stabilization. Accordingly, the method also includes separately forming multiple hafnium oxide monolayers creating a hafnium oxide multilayer, separately forming multiple lanthanum oxide monolayers creating a lanthanum oxide multilayer, and repeating to form a plurality of hafnium oxide multilayers interspersed among a plurality of lanthanum oxide multilayers. The number of hafnium oxide or lanthanum oxide monolayers formed as a part of each multilayer may be selected to correspond with the desired stability of the composite dielectric thus formed. As the number of monolayers comprised by a hafnium oxide multilayer increases, the risk of thermal instability also increases. The same is true for lanthanum oxide.

However, the likelihood of instability may increase at a different rate for hafnium oxide in comparison to lanthanum oxide for a given number of monolayers. Accordingly, it may be suitable to group a larger number of monolayers of one material into a multilayer while not suitable for the other material. Differing numbers of monolayers between hafnium oxide and lanthanum oxide may thus produce a composite dielectric comprising 10-90 atomic percent (at. %) hafnium oxide and 10-90 at. % lanthanum oxide. Preferably, the composite dielectric includes 25-75 at. % hafnium oxide and 25-75 at. % lanthanum oxide, but most preferably approximately 50 at. % of each. The hafnium oxide can include $HfO_2$ and the lanthanum oxide can include $La_2O_3$.

In accordance with the knowledge of those of ordinary skill now known or later developed, the substrate temperature during ALD may influence the particular crystalline phase assumed by the deposited material. $HfO_2$ is known to form three crystal structures and $La_2O_3$ is known to form two crystal structures, as described in Table 1 herein. Preferably, substrate temperature is from about 180° C. to about 425° C., or more preferably from 250° C. to 400° C. Thus, substrate temperature may be selected to obtain a deposited material having a desired crystal structure selected from among the structures listed in Table 1. It is conceivable that temperature may be altered such that different layers of the same compound exhibit different crystal structures.

According to another aspect of the invention, a composite dielectric forming method includes chemisorbing at least one monolayer of a first material over a substrate, the first material containing a first metal, and treating at least some of the chemisorbed first material, forming an oxide of the first metal. The method includes chemisorbing on the first metal oxide at least one monolayer of a second material containing a second metal and treating at least some of the chemisorbed second material, forming an oxide of the second metal. One of the first and second metals includes hafnium and the other includes lanthanum. The first material can include $HfCl_4$ and/or other hafnium-containing materials known to those skilled in the art. Instead, the first material can include $La(thd)_3$, where thd is 2,2,6,6-tetramethyl-3,5-heptanedione, and/or other lanthanum-containing materials known to those skilled in the art. Treating the chemisorbed first material can include exposure to $H_2O$, and/or other materials known to those skilled in the art.

In a further aspect of the invention, a composite dielectric forming method includes ALD of a first material on a substrate using a first precursor containing a first metal, exposing the deposited first material to oxygen, and forming an oxide of the first metal. The method includes ALD of a second material on the first metal oxide using a second precursor containing a second metal, exposing the deposited second material to oxygen, and forming an oxide of the second metal. One of the first and second metals includes hafnium and the other includes lanthanum.

In keeping with the concept of ALD described herein, a purge may be provided after deposition of a material before exposure to oxygen as well as after exposure to oxygen before another deposition step. Pulsing of a precursor during deposition and pulsing of oxygen during exposure to oxygen can both be about 2 seconds. Nitrogen ($N_2$) may be used as a carrier gas for precursors and oxygen as well as a purging gas and preferably has a purity of greater than 99.999%. The pressure during film deposition can be from about 2 to about 3 millibar. $La(thd)_3$ as a precursor may be synthesized from 99.99% $La_2O_3$ according to methods known to those skilled in the art and then purified by sublimation.

Figure 1A:
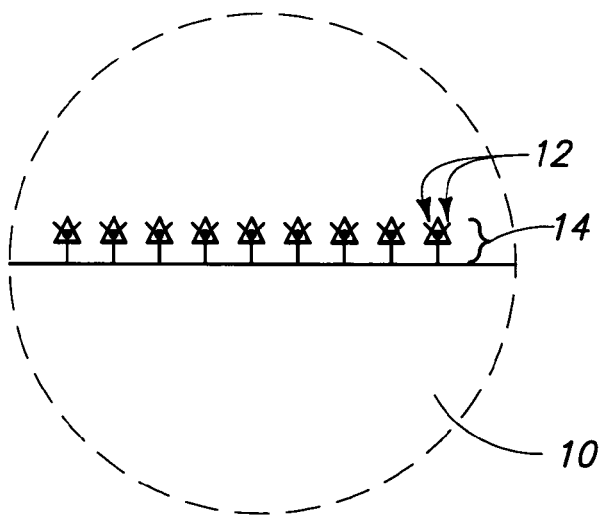
FIG. 1A is an enlarged view of a portion of the transistor construction shown in FIG. 1.

FIG. 1 shows a partial cross-sectional view of a substrate 10 whereon a composite dielectric may be formed. Substrate 10 may comprise a semiconductor substrate in the case when a gate dielectric is to be formed or a bottom electrode when a capacitor is to be formed. A first precursor is chemisorbed on substrate 10 forming a first monolayer 14 as shown in FIG. 1. FIG. 1A shows an enlarged view of a portion of substrate 10 and first monolayer 14 from FIG. 1. FIG. 1A shows in a graphical representation, not by way of limitation, individual molecules of the first precursor chemisorbed to substrate 10. The individual molecules may have one or more reactive sites 12, depending upon the particular precursor.

Figure 2:
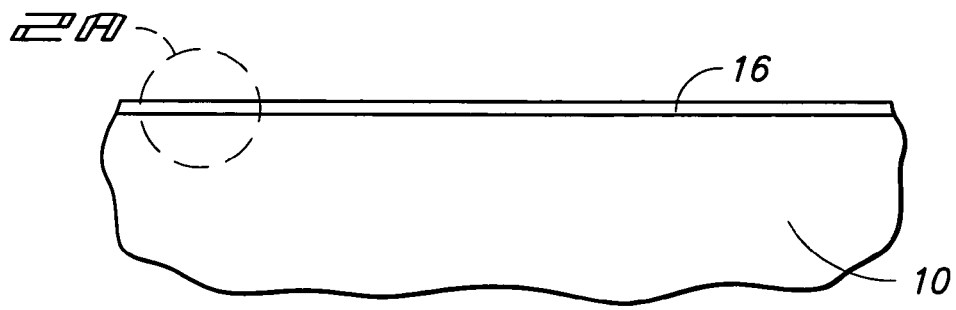
FIG. 2 is a partial sectional view of a transistor construction at a process stage subsequent to that shown in FIG. 1.

A second precursor is reacted with the chemisorbed first precursor to form a product monolayer 16 on substrate 10 as shown in FIG. 2. Product monolayer 16 is a reaction product of the first and second precursors. FIG. 2A shows in a graphical representation, not by way of limitation, individual molecules of the second precursor reacted and bonded to the chemisorbed first precursor molecules. Bonding may occur to first monolayer 14 at one or more of reactive sites 12. The reacted second precursor forms, at least in the graphical representation, a second monolayer 22. Depending on the particular precursors, reaction of the second precursor with the chemisorbed first precursor can change the composition of individual molecules comprised by first monolayer 14. Accordingly, first monolayer 14 is represented in FIG. 2A as changed to a reacted first monolayer 24.

Although not shown graphically in the Figures, the second precursor can merely react with the first precursor, but not chemisorb additional material to first monolayer 14. Such would be the case when the second precursor cleaves some portion of the chemisorbed first precursor leaving reacted first monolayer 24 without second monolayer 22 formed thereon. Reacted first monolayer 24 may thus form a completed product layer 16 or an additional precursor may be used to add material to reacted first monolayer 24, forming product layer 16.

Exposure of the chemisorbed layers to the first and second precursors, or different precursors, can be repeated forming successive first monolayers 14 and second monolayers 22 to provide a dielectric layer 18 as shown in FIG. 3. In the context of $HfCl_4$ as a first precursor and $H_2O$ as a second precursor, $HfCl_4$ chemisorbs to substrate 10, excess precursor is purged, and $H_2O$ reacts with the chemisorbed precursor, releasing HCl and forming $HfO_2$ on substrate 10. For illustration purposes, second monolayer 22 in FIG. 2A can represent the oxygen from $H_2O$ included in the $HfO_2$ of product layer 16. Even so, those of ordinary skill will recognize that it may be more technically accurate to describe the oxygen as becoming a part of the original chemisorbed $HfCl_4$ monolayer given the substitution of oxygen for chlorine purged from the substrate as a reaction byproduct along with hydrogen from the $H_2O$. In the context of $La(thd)_3$ as a precursor chemisorbed on substrate 10, a similar mechanism may take place where the oxygen of $H_2O$ forms $La_2O_3$ and the $(thd)_3$ and hydrogen from $H_2O$ are purged as reaction byproducts.

In accordance with the various aspects of the invention herein, dielectric layer 18 can be a composite dielectric that includes both hafnium oxide and lanthanum oxide. A top electrode (not shown) can be formed over dielectric 18 in the case where substrate 10 is a bottom electrode to create a capacitor construction. Also, as shown in FIG. 4, dielectric layer 18 maybe processed according to the knowledge of those skilled in the art to form a transistor with a word line construction including dielectric layer 18 as a gate dielectric, gate 20, and side wall spacers 26. Notably, the aspects of the invention described herein are applicable to a variety of transistor and capacitor constructions in addition to those shown and/or described herein. The aspects of the invention are particularly valuable in forming gate and capacitor dielectrics in small geometries.

Accordingly, a still further aspect of the invention includes a composite dielectric having alternate monolayers of hafnium oxide and lanthanum oxide over a substrate. As an example, the dielectric can include a plurality of single hafnium oxide monolayers interspersed among a plurality of single lanthanum oxide monolayers. Alternatively, the dielectric can include a plurality of hafnium oxide multilayers interspersed among a plurality of lanthanum oxide multilayers, the multilayers containing multiple monolayers.

Also, another aspect of the invention includes a composite dielectric having alternate monolayers of crystalline hafnium oxide and crystalline lanthanum oxide over a substrate. The monolayers may exhibit the property of being thermally stable at one atmosphere pressure and 20° C. temperature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A composite dielectric forming method comprising:
   chemisorbing a monolayer of a first material on and in contact with a conductive or semiconductive substrate, the first material containing hafnium;
   treating at least some of the chemisorbed first material and forming hafnium oxide;
   chemisorbing on the hafnium oxide a monolayer of a second material containing lanthanum; and
   treating at least some of the chemisorbed second material and forming lanthanum oxide.

2. The method of claim 1 wherein the first material comprises $HfCl_4$ and the treating the chemisorbed first material comprises exposure to $H_2O$.

3. The method of claim 1 wherein the monolayer of the first material consists of one monolayer.

4. The method of claim 1 wherein the hafnium oxide comprises thermally stable, crystalline hafnium oxide.

5. The method of claim 1 wherein the second material comprises La(thd)$_3$ and the treating the chemisorbed second material comprises exposure to H$_2$O.

6. The method of claim 1 wherein the monolayer of the second material consists of one monolayer.

7. The method of claim 1 wherein the lanthanum oxide comprises thermally stable, crystalline lanthanum oxide.

8. The method of claim 1 wherein the substrate temperature is from about 180° C. to about 425° C.

9. The method of claim 8 wherein the substrate temperature is from 250° C. to 400° C.

10. The method of claim 1 further comprising forming successive monolayers of the hafnium oxide and the lanthanum oxide.

11. A composite dielectric forming method comprising:
   chemisorbing a monolayer of a first material over a substrate, the first material containing a first metal;
   treating at least some of the chemisorbed first material and forming an oxide of the first metal;
   chemisorbing on the first metal oxide a monolayer of a second material containing a second metal; and
   treating at least some of the chemisorbed second material and forming an oxide of the second metal, one of the first and second metals containing hafnium and the other containing lanthanum, the oxide of lanthanum containing crystalline lanthanum oxide.

12. The method of claim 11 wherein the first material comprises HfCl$_4$ and the treating the chemisorbed first material comprises exposure to H$_2$O.

13. The method of claim 11 wherein the oxide of the first metal comprises thermally stable, crystalline hafnium oxide.

14. The method of claim 11 wherein the first material comprises La(thd)$_3$ and the treating the chemisorbed first material comprises exposure to H$_2$O.

15. The method of claim 11 wherein the oxide of the first metal comprises thermally stable, crystalline lanthanum oxide.

16. The method of claim 11 wherein the substrate temperature is from about 180° C. to about 425° C.

17. The method of claim 16 wherein the substrate temperature is from 250° C. to 400° C.

18. The method of claim 11 further comprising forming successive monolayers of the first metal oxide and the second metal oxide.

19. A composite dielectric forming method comprising:
   chemisorbing one monolayer of hafnium over a substrate;
   treating the chemisorbed hafnium and forming a thermally stable, crystalline hafnium oxide;
   chemisorbing on the hafnium oxide at least one monolayer of lanthanum; and
   treating the chemisorbed lanthanum and forming lanthanum oxide.

20. The method of claim 19 wherein the lanthanum oxide comprises thermally stable, crystalline lanthanum oxide.

* * * * *